United States Patent
Zhang et al.

[11] Patent Number: 6,147,492
[45] Date of Patent: Nov. 14, 2000

[54] QUANTITATIVE MR IMAGING OF WATER AND FAT USING A QUADRUPLE-ECHO SEQUENCE

[75] Inventors: Weiguo Zhang, Foster City; Joseph W. Carlson, Kensington, both of Calif.

[73] Assignee: Toshiba America MRI, Inc., Tustin, Calif.

[21] Appl. No.: 09/179,955

[22] Filed: Oct. 28, 1998

[51] Int. Cl.$^7$ .................................................. G01V 3/00
[52] U.S. Cl. ......................... 324/309; 324/307; 600/410
[58] Field of Search ........................ 324/309, 307, 324/314, 300; 600/410, 411

[56] References Cited

U.S. PATENT DOCUMENTS

| 5,256,967 | 10/1993 | Foo et al. ............................... | 324/311 |
| 5,347,216 | 9/1994 | Foo ....................................... | 324/309 |
| 5,594,336 | 1/1997 | Gullapalli et al. .................... | 324/309 |

OTHER PUBLICATIONS

J. Ma et al "A Single–Scan Imaging Technique for Measurement of the Relative Concentrations of Fat and Water Protons and Their Transverse Relaxation Times," *Journal of Magnetic Resonance* 125, 92–101 (1997), Article No. MN961086, pp. 92–101.

W. Zhang et al "Separation of Water and Fat MR Images in a Single Scan at .35 T Using 'Sandwich' Echoes," JMRI Nov./Dec. 1996, vol. 6, No. 6, pp. 909–917.

Vogler III, et al "Bone Marrow Imaging," *Radiology*, vol. 168, No. 3 (1988) pp. 679–691.

Buxton et al "Quantitative Proton Chemical–Shift Imaging," *Magnetic Resonance in Medicine* 3, 881–900 (1986).

Rosen et al "Hematologic Bone Marrow Disorders: Quantitative Chemical Shift MR Imaging," *Radiology*, Dec. 1988, pp. 799–804.

Johnson et al "Quantitative Chemical Shift Imaging of Vertebral Bone Marrow in Patients with Gaucher Disease," *Radiology*, vol. 182, No. 2, Feb. 1992, pp. 451–455.

Jensen et al "Localized in Vivo Proton Spectroscopy of the Bone Marrow in Patients with Leukemia," *Magnetic Resonance Imaging*, vol. 8, pp. 779–789 (1990).

*Primary Examiner*—Christine Oda
*Assistant Examiner*—Brij B. Shrivastav
*Attorney, Agent, or Firm*—Nixon & Vanderhye P.C.

[57] ABSTRACT

A magnetic resonance imaging (MRI) method and apparatus is disclosed for quantitating water and fat content of tissues using nuclear magnetic resonance (NMR) image data of the tissues and for producing an images indicative of the fat and water fractions of the total water and fat content of the tissues. To reduce the overall scanning time, a quadruple field-echo imaging scan sequence is used to acquire the image data. Each imaging sequence comprises an initial slice-selective RF excitation pulse followed by four magnetic field read-out gradient pulses and the acquisition of four separate field-echoes. Each field-echo is generated through the controlled timing and polarity of an applied read gradient. The period of time between field-echoes (T) is selected according to the chemical-shift difference between water and fat signals so that the two signals develop between them an angular phase difference of $\pi$ radians (180°) during the inter-echo time. Resulting field-echo signals acquired from two scans, one scan preferably having a sequence repetition period (TR) twice that of the other, are analyzed to determine the tissue fat and water fractions for each pixel and produce corresponding fraction images.

24 Claims, 11 Drawing Sheets

Fig. 4C

( From Fig. 4A )

↓

**Determine $T_2^*$ relaxation factors:**

$$\alpha + \beta = \frac{S_1^+ S_4^+ - S_2^+ S_3^+}{S_1^+ S_3^+ - (S_2^+)^2} \equiv a$$

$$\alpha\beta = \frac{S_2^+ S_4^+ - (S_3^+)^2}{S_1^+ S_3^+ - (S_2^+)^2} \equiv b$$

$$\alpha = \tfrac{1}{2}[a + \sqrt{a^2 - 4b}]$$

$$\beta = \tfrac{1}{2}[a - \sqrt{a^2 - 4b}]$$

— 15

↓

**Remove $T_2^*$ relaxation:**

$$W^n = \frac{\sum_{m=1}^{4} S_m^n (\beta)^m \sum_{m=1}^{4}(\alpha\beta)^m - \sum_{m=1}^{4} S_m^n (\alpha)^m \sum_{m=1}^{4}(\beta)^{2m}}{[\sum_{m=1}^{4}(\alpha\beta)^m]^2 - \sum_{m=1}^{4}(\alpha)^{2m}\sum_{m=1}^{4}(\beta)^{2m}}$$

$$F^n = \frac{\sum_{m=1}^{4} S_m^n (\alpha)^m \sum_{m=1}^{4}(\alpha\beta)^m - \sum_{m=1}^{4} S_m^n (\beta)^m \sum_{m=1}^{4}(\alpha)^{2m}}{[\sum_{m=1}^{4}(\alpha\beta)^m]^2 - \sum_{m=1}^{4}(\alpha)^{2m}\sum_{m=1}^{4}(\beta)^{2m}}$$

— 16

↓

**Remove $T_1^*$ relaxation and determine equilibrium magnetization values:**

$$W^0 = \frac{(W^1)^2}{2W^1 - W^2}$$

$$F^0 = \frac{(F^1)^2}{2F^1 - F^2}$$

— 17

↓

Determine fat and water fractions f/w:

$$f = \frac{F^0}{W^0 + F^0} \qquad W = \frac{W^0}{W^0 + F^0}$$

— 18

↓

Register pixel into fat and water fraction imager

TE = 10.3 ms

TE = 20.6 ms

TE = 30.9 ms

TE = 41.2 ms

TE = 10.3 ms

TE = 20.6 ms

TE = 30.9 ms

TE = 41.2 ms

QUANTITATIVE MR IMAGING OF WATER AND FAT USING A QUADRUPLE-ECHO SEQUENCE

FIELD OF THE INVENTION

This invention relates generally to magnetic resonance (MR) imaging (MRI) techniques. In particular, it relates to methods and apparatus for MR imaging of water and fat using a quadruple field-echo sequence and, more particularly, to a method for quantitatively determining tissue fat and water fractions and generating fat and water fraction images.

BACKGROUND OF THE INVENTION

Magnetic Resonance Imaging (MRI) has become a widely accepted and commercially available technique for obtaining digitized visual images representing the internal structure of objects (such as the human body) having substantial populations of atomic nuclei that are susceptible to nuclear magnetic resonance (NMR) phenomena. In MRI nuclei in a body to be imaged are polarized by imposing a strong main magnetic field $H_0$ on the nuclei. Selected nuclei are excited by imposing a radio frequency (RF) signal at a particular NMR frequency. By spatially distributing the localized magnetic fields, and then suitably analyzing the resulting RF responses from the nuclei, a map or image of relative NMR responses as a function of the location of the nuclei can be determined. Following a Fourier analysis, data representing the NMR responses in space can be displayed on a CRT.

As shown in FIG. 1, the NMR imaging system typically includes a magnet 10 to impose the static magnetic field, gradient coils 14 for imposing spatially distributed magnetic fields along three orthogonal coordinates, and RF coils 15 and 16 to transmit and receive RF signals to and from the selected nuclei. The NMR signal received by the coil 16 is transmitted to a computer 19 which processes the data into an image displayed on display 24. The magnetic resonance image is composed of picture elements called "pixels." The intensity of a pixel is proportional to the NMR signal intensity of the contents of a corresponding volume element or "voxel" of the object being imaged. The computer 19 also controls the operation of RF coils 15 and 16 and gradient coils 14 through the RF amplifier/detector 21 and 22 and gradient amplifiers 20, respectively.

Only nuclei with odd number of protons and/or neutrons have a magnetic moment and thus are susceptible to NMR phenomena. In MRI, a strong static magnetic field is employed to align nuclei, generating a gross magnetization vector aligned in parallel to the main magnetic field at equilibrium. A second magnetic field, applied transverse to the first field as is a single RF pulse, pumps energy into the nuclei, which causes the gross magnetization vector to flip by, for example, 90°. After this excitation, the nuclei precess and gradually relax back into alignment with the static field. As the nuclei precess and relax, they will induce a weak but detectable electrical energy in the surrounding coils that is known as free induction decay (FID). These FID signals (and/or magnetic gradient-refocused field echoes thereof), collectively referred to herein as MR signals, are analyzed by a computer to produce images of the nuclei in space.

An operation whereby the various coils produces RF excitation pulses and gradient fields to result in and acquire an MR signal is called an MRI acquisition sequence. A graphical representation of an example MRI acquisition sequence used for 3-D MRI is shown in FIG. 2. In this example. the particular timing of applied pulses and fields is known as a field-echo sequence since the MR signals appear as gradient-refocused field echoes. First, a gradient field, $G_{slice}$, is superimposed along the main field to sensitize a slab of nuclei in the body to be imaged to a particular RF resonance frequency. An RF excitation field or nutation pulse, θ, is then applied at the particular frequency to tip the magnetization away from equilibrium. Thereafter, pulsed magnetic gradient fields of changing magnitudes, $G_{pe}$ and $G_{slice}$, are used to phase encode the nuclei by inducing a temporary frequency difference, and hence phase differences, between nuclei in different locations along a specific direction within the slab. At the same time, another pulsed magnetic gradient field, $G_{ro}$, is applied perpendicular to the direction of $G_{pe}$, in a readout (ro) direction that first de-phases and then rephases the precessing nuclei—which results in producing field-echo MR signal S. The time from the center of nutating pulse, θ, to the center of the field-echo MR signal is designated as the echo time, TE, and the entire pulse sequence duration is designated as TR.

Essentially, the applied gradient field, $G_{ro}$, frequency encodes the selected slab of nuclei in the readout direction. The resultant MR signal, S, (also called "raw data" or "k-space data") is then read and analyzed by Fourier analysis. A frequency domain plot of that analysis is then scaled to render information about the nuclei population in Fourier space (also referred to as the image domain), which corresponds to an X-Y-Z position.

A magnetization vector can be decomposed into longitudinal and transverse components in reference to the main $B_0$ field. Conventionally, the longitudinal component is defined as parallel to the $B_0$ field and the transverse component is defined as perpendicular to $B_0$. Once the magnetic vectors are disturbed from their equilibrium, processes known as "relaxation" cause the longitudinal component to recover to an equilibrium magnitude, $M_0$, in alignment with the background $B_0$ field, and the transverse component to decay. These relaxation processes are termed the "spin-lattice relaxation" and the "spin-spin relaxation" and are characterized by exponentials whose defined time constants are labeled as $T_1$ and $T_2$, respectively. In addition to $T_2$ relaxation, inhomogeneities in magnetic field cause the transverse component to further decay. An "apparent relaxation" time constant, $T_2^*$, is therefore defined as characterizing transverse signal decay due to both spin-spin relaxation and the presence of $B_0$ field inhomogeneities.

The NMR frequency and the main $B_0$ field are related by the Larmor relationship. This relationship states that the angular frequency, $\omega_0$, of the precession of the nuclei is the product of the magnetic field, $B_0$, and the so-called magnetogyric ratio, γ, a fundamental physical constant for each nuclear species:

$$\omega_0 = B_0 \cdot \gamma (1-\sigma)$$

where σ is a shielding factor representing the chemical environment around the nuclei, commonly referred to as the "chemical shift."

The RF spin-nutating pulse will, of course, tip more than one species of the target isotope in a particular area. After being tipped away from equilibrium, each species of nuclei will begin to precess at their own characteristic speed. The phase of the precessing nuclei species will gradually differ (de-phase) as a result of such parameters as the physical or chemical environment in which the nuclei are located. Nuclei in fat, for example, precess at a different rate than do nuclei in water due to the effects of chemical shift. In addition, inhomogeneities in the magnetic field also contribute to de-phasing of the nutated precessing nuclei.

Since hydrogen nuclei have a readily discernible NMR signal and are the most abundant isotope of the human body, human MRI primarily images the NMR signal from the hydrogen nuclei. Water and fat are the main tissue components containing hydrogen nuclei.

In addition to using the frequency information content of an MR signal to generate images, the phase of an MR signal in the frequency domain can be utilized to provide information indicative of some physical quantity. For example, depending on the type of pulse sequence used, the MR phase can be used to differentiate between water and fat. It can also represent a main $B_0$ field inhomogeneity or can be proportional to the velocity of the moving spins.

I. Water and Fat Separation

Although MR images of both water and fat may contain the same or different diagnostic information, they often interfere with each other's interpretation when overlapped in an MRI image, and thus make it difficult to properly interpret the composite MR image.

At high-magnetic-field strengths, the separation of water and fat images or suppression of one of these two components can be achieved using selective excitation or non-excitation approaches. At mid- or low-field strengths, approaches based on chemical shift selectivity become impractical, if not impossible. At all field strengths, the difficulties of water/fat image separation are further exacerbated when imhomogeneities are present in the magnetic field.

One group of techniques, known as "Three-Point Dixon" methods, have attractive features for mid- or low-field strength applications. These methods require three images to obtain enough information for water/fat separation with correction of the effect of $B_0$ field inhomogeneities. The images can be acquired using spin-echo as well as field-echo sequences, in three separate scans as described in "Three-Point Dixon Technique for True-Water-Fat Decompositions with $B_0$ Inhomogeneity Corrected," by Glover et al., *Magnetic Resonance in Medicine* 18, 371–383 (1991); in two scans, "Separation of True Fat and Water Images by Correcting Magnetic Field Inhomogeneity In Situ", by Yenng et al., *Radiology* 159, 783–786 (1986), or in a single scan, "True Water and Fat MR Imaging with Use of Multiple-Echo Acquisition", by William et al., *Radiology* 173, 249–253 (1989) and "Separation of Water and Fat MR Images in a Single Scan at 0.35 T Using 'Sandwich' Echoes," by Zhang et al, JMRI 6, 909–917 (1996), all the above of which are incorporated herein by reference.

In accordance with the above Three-Point Dixon methods, acquisitions of the three images are controlled so that the phase difference ro between the water image information and the fat image information changes by $\pm\pi$ radians (180°) between the three images (i.e., $S_{-\pi}$, $S_0$, and $S_\pi$). Data from the three images is then processed to remove the effects of magnetic field inhomogeneities and, ultimately, to generate separate water and fat images. In accordance with the method, magnetic field inhomo-geneities are compensated by using information from two of the three images through a process of "phase unwrapping."

Since the phase angle of a complex number is unambiguous only between $-\pi$ and $\pi$, the phase of an MRI signal cannot be unambiguously determined from its argument, and any phase values beyond $-\pi$ or $\pi$ will be "wrapped" back around into values between $-\pi$ and $\pi$. Phase unwrapping is a process of determining the absolute phase of a complex signal given the measurement of its principal phase value.

Ignoring the effects of relaxation, the three Dixon images can be described by:

$$S_{-\pi}=(W-Fe^{-i\psi 0})e^{-i(\phi 0-\phi)}$$

$$S_0=(W+Fe^{-i\psi 0})e^{-i\phi 0}$$

$$S_\pi=(W-Fe^{-i\psi 0})e^{-i(\phi 0+\phi)}$$

where W and F represent water and fat signals, respectively; $\psi_0$ is the phase difference between water and fat observed in $S_0$; $\phi_0$ is the phase in $S_0$ due to field inhomogeneities and other system sources; $\phi$ is phase change between the successive echoes induced by field inhomogeneities.

To correct for field inhomogeneities, the compensation angle, $\phi$, is determined from $S_{-\pi}$ and $S_\pi$ by the process of phase unwrapping:

$$\phi=\tfrac{1}{2}\text{unwrap}\{\arg(S_{-\pi}\cdot S^*_\pi)\}$$

where arg ( ) produces the phase angle of a complex number, and * represents complex conjugation.

Water-only images and fat-only images can then be reconstructed in accordance with the following two relationships:

$$W=S_0+0.5S_\pi e^{+i\phi}+0.5S_{-\pi}e^{-i\phi}$$

$$F=S_0-0.5S_\pi e^{i\phi}-0.5S_{-\pi}e^{-i\phi}$$

One can also rely on just one image, S, in which the water and fat signals have a difference in phase by 180°. Though water and fat signals are not truly separated in such cases, image pixels can be sorted in accordance to whether they are dominated by water or by fat:

$$S=(W-F)e^{-i\phi}$$

$$\phi=-\tfrac{1}{2}\text{unwrap}\{\arg(S^2)\}$$

$$I_{water\text{-}pixel}=|S|+Se^{i\phi}$$

$$I_{fat\text{-}pixel}=|S|-Se^{i\phi}$$

where $I_{water\text{-}pixel}$ and $I_{fat\text{-}pixel}$ represent water-dominant and fat-dominant pixels, respectively.

II. Phase Unwrapping Algorithms

Preferred algorithms for phase unwrapping as implemented in the present invention involve a combination of modeling the static magnetic field using polynomial functions and a guided phase unwrapping by region-growing.

i. Polynomial Field Modeling

The magnetic field is modeled using a polynomial function:

$$B(x,y)=\sum_{n=1}^{3}[a_n(x-x_o)^n+b_n(y-y_o)^n]+c_o$$

To find the coefficients $a_n$ and $b_n$, partial spatial derivatives of the phase value $\phi$ are calculated and fit to polynomial functions as follows:

$$\frac{\partial\phi(x,y)}{\partial x}=p_3 x^2+p_2 x+p_1$$

-continued $$\frac{\partial \phi(x, y)}{\partial y} = q_3 y^2 + q_2 y + q_1$$

Fitting is performed using a weighted least-square with the weighting factors determined according to:

$$w(x, y) = \frac{S(x, y)}{S_{max}}$$

where $S(x,y)$ is the pixel value in the in-phase image and $S_{max}$ is the maximum of that image.

Using $p_n$ and $q_n$, $a_n$ and $b_n$ are calculated according to the following equations:

$$a_1 = p_1 + 2p_2 x_0 + p_3 x_0^2$$

$$a_2 = \frac{1}{2} p_2 + p_3 x_0$$

$$a_3 = \frac{1}{3} p_3$$

$$b_1 = q_1 + 2q_2 y_0 + q_3 y_0^2$$

$$b_2 = \frac{1}{2} q_2 + q_3 y_0$$

$$b_3 = \frac{1}{3} q_3$$

ii. Phase Unwrapping by Guided Region Growing

The phase image is unwrapped using a guided region-growing algorithm as follows:

(a) A pixel in the image is chosen as the subseed for unwrapping and the measured phase value is assigned to the final phase value used for water and fat image reconstruction.

$$\phi_f(x_0, y_0) = \phi(x_0, y_0)$$

(b) The subseed is selected so that all pixels in a 6×6 region centered at the subseed have sufficient signal strength. The four immediately neighboring pixels of the subseed are first unwrapped by comparing the phase values to the subseed value. If the difference is larger than a predetermined threshold, a $2\pi$ unwrapping is executed:

$$\phi_f = \phi + \text{sign}(\Delta\phi) \times 2\pi$$

where $$\Delta\phi = \phi - \phi(x_0, y_0)$$

(c) A 3×3 pixel region centered at the subseed is then built based on the five already-determined pixels. A $2\pi$ phase unwrapping is executed whenever the phase difference between a pixel and its already-unwrapped, immediate neighboring pixel is larger than the threshold.

(d) The 3×3 region is then expanded to 4×4 region with a three-pixel prediction:

$$\phi_p = \frac{1}{3}(\phi_f^{-3} + \phi_f^{-2} + \phi_f^{-1})$$

$$+ \frac{1}{3}(3\Delta\phi^{-1} + 2\Delta\phi^{-2} + \Delta\phi^{-3})$$

where $\phi_p$ is the predicted phase value of a pixel; $\phi_f^{-i}$ (i=1, 2, 3) are the phase values of the already unwrapped first (i=1), second (i=2). and third (i=3) neighboring pixels; $\Delta\phi^{-i}$ are the phase spatial derivatives of the already-unwrapped, neighboring pixel along the direction of the prediction.

Unwrapping is executed if $\Delta\phi = \phi - \phi_p$ is larger than the threshold.

(e) Continuing from the 4×4 seed region, a four column by four rows "cross" region is built using a four-pixel prediction:

$$\phi_p = \frac{1}{4}(\phi_f^{-4} + \phi_f^{-3} + \phi_f^{-2} + \phi_f^{-1})$$

$$+ \frac{1}{4}(4\Delta\phi_f^{-1} + 3\Delta\phi_f^{-2} + 2\Delta\phi_f^{-3} + \Delta\phi_f^{-4})$$

(f) Using the cross, the four quadrants of the image are unwrapped using the same 4-pixel prediction approach, but in two directions. Unwrapping is executed when both directions show the same execution for unwrapping. In other situations, the average of the predicted values is used. When the pixel value is below the intensity threshold, the phase value is again set to the predicted average value.

III. Quantitative Separation of Water and Fat

Application of the three-point Dixon methods, as previously discussed, results in separated water and fat images. However, the intensities of the separated images are strongly modulated by spin relaxation and thus cannot be used to quantitate tissue contents of water and fat. In many clinical applications, however, quantitation of tissue water and fat fractions is highly desirable. For example, tissue fat fraction, particularly in bone marrow, can be an important indicator of the development and health of an individual.

There have been many attempts to quantitate water and fat content using both MRI and localized nuclear magnetic resonance spectroscopy (MRS). For example, see "Quantitative Proton Chemical-Shift Imaging" by R. B. Buxton et al., *Magnetic Resonance in Medicine*, 3:881–900 (1986) and "Localized In Vivo Proton Spectrocopy of the Bone Marrow In Patients With Leukemia" by K. E. Jensen et al., *Magnetic Resonance in Imaging*, 8:779–789 (1990).

Typical quantitative chemical-shift imaging (QCSI) methods require as many as six scans using different combinations of in-phase/out-of-phase, short TE/long TE, and short TR/long TR sequence scans. For example, see "Quantitative Chemical Shift Imaging of Vertebral Bone Marrow In Patients With Gaucher Disease," by L. A. Johnson et al., *Radiology*, 182:451–455 (1992), and "Hematologic Bone Marrow Disorders: Quantitative Chemical Shift MR Imaging" by B. R. Rosen et al., *Radiology*, 169:299–804 (1988). Unfortunately, especially for the patient in a clinical setting, the requirement of so many scans can result in uncomfortably long examination times.

Recently, a single scan chemical-shift imaging technique has been introduced for quantitating water and fat. It is based on sampling a train of echoes preceding and following the phase-reversal RF pulse. The echoes are spaced at one-half of the chemical-shift modulation period. While this method may work well at high fields, the increased chemical-shift modulation period at mid- and low-fields makes it difficult to generate and acquire the large number of echoes required by the method. See "A Single-Scan Imaging Technique for Measurement of Relative Concentration of Fat and Water Protons and Their Transverse Relaxation Times," by J. Ma et al., *J. Magn. Reson.* 125, 92–101 (1997).

SUMMARY OF THE INVENTION

The present invention is a new MRI technique for quantitating water and fat content that utilizes a quadruple field-echo sequence to achieve improvements in total scan time. Compared with other to independently known methods employing quantitative chemical shift imaging (QCSI) which may require up to six scans, the present invention accomplishes quantitative water/fat separation (QWFS)

using only two scans or a single scan with a long TR. As a consequence, the present invention is more economical than conventional techniques.

The Imaging Sequence

Basically, the imaging sequence of the present invention comprises a slice-selective excitation pulse followed by the acquisition of four separate gradient-refocused field-echoes. Each field echo is acquired by controlling the timing and polarity of an applied read-out gradient. The time between the field-echoes (T) is selected according to the chemical-shift difference between water and fat signals so that the two signals develop between them an angular difference of $\pi$ radians (180°) during the inter-echo time. To account for $T_1$ relaxation when a short TR is used, two scans are performed with different TR and with a flip angle of 90°. The data are recorded and analyzed on a pixel by pixel basis to determine the tissue fat and water fractions. In accordance with a preferred example embodiment, the TR for one of the two scans is twice that of the other. Alternatively, a single scan can be performed with a sufficiently long TR so that $T_1$ relaxation can be ignored.

The Data Processing Method

After Fourier conversion of the raw data (k-space data) to complex frequency-domain data, also called "image-domain" data, background magnetic field inhomogeneities are compensated by obtaining the compensation phase from the in-phase water/fat component data using a guided region growing phase unwrapping technique. Next, the effects of $T_1$ relaxation in case of double scans and $T_2^*$ relaxation are removed before the tissue fat and water fractions are determined. The process of removing $T_2^*$ relaxation depends on whether a pixel or a region of interest (ROI) contains one or both fat and water signal components. For single component cases, averaging is performed to improve signal-to-noise performance. Fat and water fractions are finally calculated for each pixel or region of interest.

BRIEF DESCRIPTION OF THE DRAWINGS

The purpose and advantages gained by the present invention will be understood by careful study of the following detailed description of the presently preferred embodiment with particular reference to the (accompanying drawings.

FIGS. 4A–4C constitute a flowchart illustrating the steps in the data processing method for QWFS as carried out by the MRI system of FIG. 1 in accordance with the present invention;

DETAILED DESCRIPTION OF THE PRESENTLY PREFERRED EMBODIMENT

As is well-known, nuclei precess at a particular frequency with a particular phase. By applying gradient fields to the nuclei in different orthogonal directions, the frequency and phase of the precessions can be used to spatially encode the nuclei. In one orthogonal direction, a "slice" of nuclei are excited. Within that slice, MR signals are extracted from the remaining two dimensions of the slice, using the frequency of precession of the selected nuclei to spatially encode the nuclei in one direction and using the phase of precession of the selected nuclei to spatially encode the nuclei in the second (or other) direction(s). By analyzing the complex frequency and phase of the resultant MR signal, information about the nuclei density in the selected slice can be determined.

Figure 1:
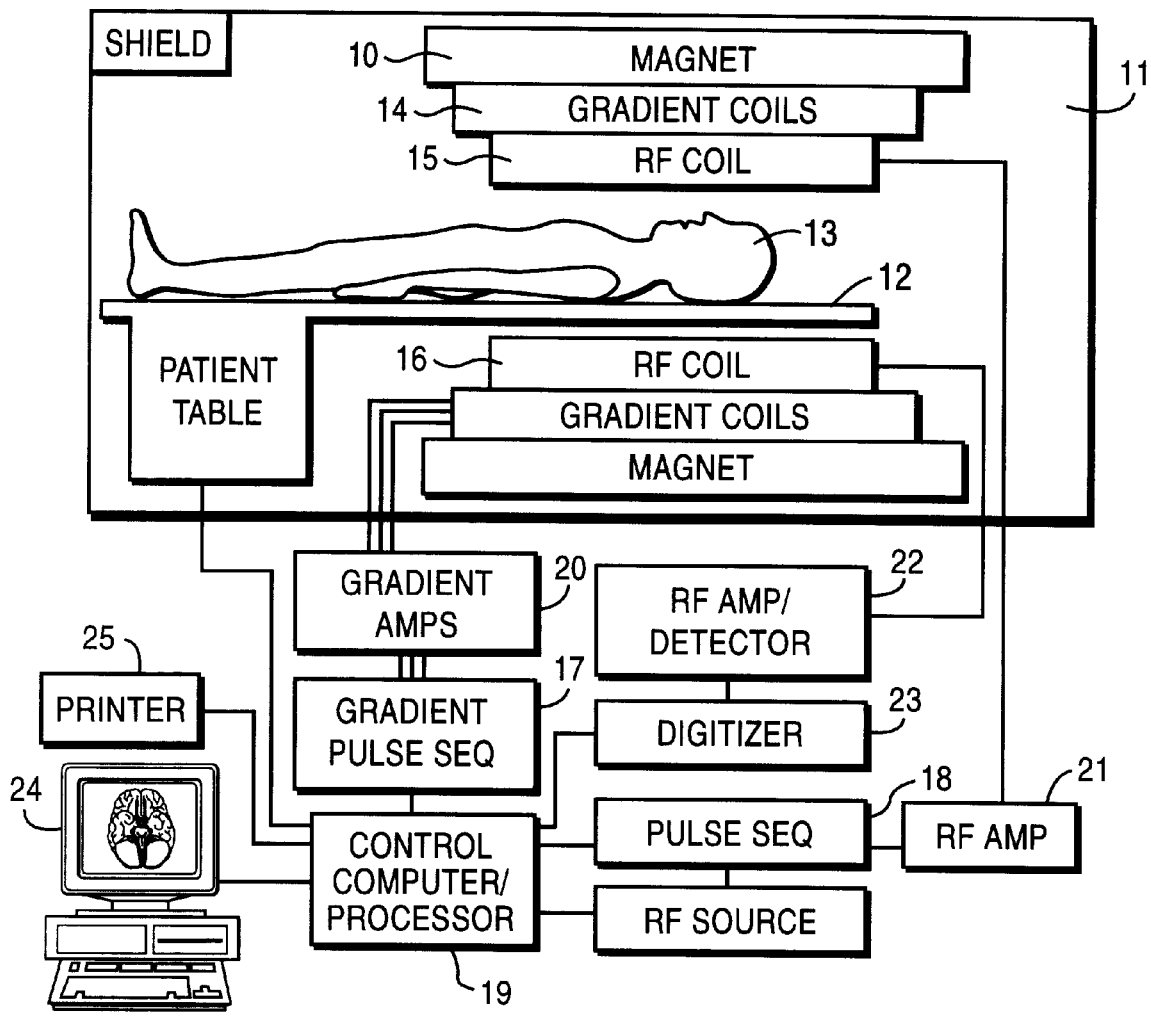
FIG. 1 is a schematic diagram of an example MRI system.
Figure 2:
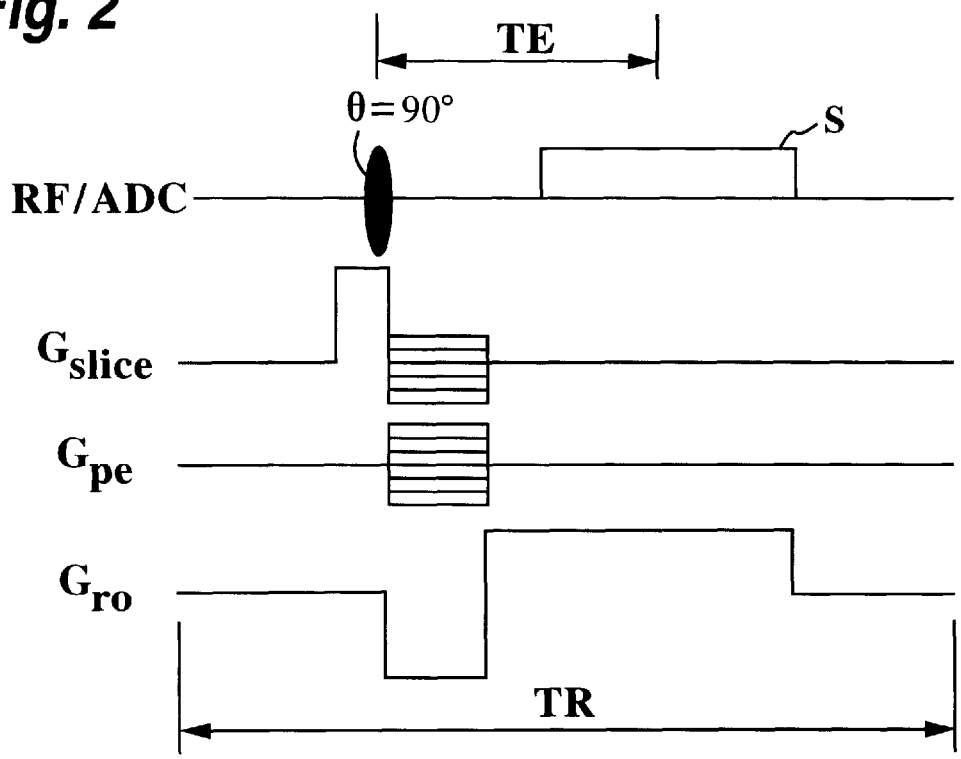
FIG. 2 is an RF and gradient waveform timing diagram of an example MRI pulse sequence for generating a field-echo MRI response for 3-D imaging.

FIG. 1 depicts an MRI system. One example of such a system is the Toshiba OPART™ MRI system. Such an MRI system may comprise a large polarizing magnet structure 10 which generates a substantially uniform homogeneous polarizing magnetic field $B_0$ within a patient imaging volume 11. A suitable carriage 12 inserts the desired portion of patient 13 anatomy within the image volume 11. Magnetic gradients are selectively created by electromagnetic gradient coils 14. RF nuclei nutation pulses are transmitted into the patient tissue within the image volume by RF coil 15. The RF responses constituting the MR signal are received from the patient tissue via suitable RF detection coil structures 16.

To acquire MRI data, the MRI system generates magnetic gradient and RF nutation pulses via MRI pulse sequence controllers 17 and 18 under the control of programmable computer/processor 19. In addition, processor 19 controls gradient pulse amplifier 20 and RF source and amplifier circuits 21 and 22. The MR signal (RF detector) circuits 22 are suitably interfaced with MR signal RFa coils 16 located within the shielded MRI system gantry. The received MR responses are digitized by digitizer 23 and passed to processor 19 which typically includes an array processor for image processing and suitable computer program storage media (not shown) wherein programs are stored and selectively utilized so as to control the acquisition and processing of MR signal data and to produce image displays on a CRT of control terminal 24. The MRI system is provided with a control terminal 24 which may include suitable keyboard switches and the like for exerting operator control over the imaging sequence controllers, 17 and 18. Images may also be recorded directly on film or on other suitable media by printing device 25.

In conjunction with system computer/processor 19, an operator is typically presented with a menu of choices for MRI sequences and data processing techniques. In the example embodiment of this invention, one of those choices available to the operator is a program for providing quantitative water and fat separation (QWFS) using only one or two scans by using a quadruple field-echo sequence. The generation of a suitable detailed computer program for effecting the described process of the present invention is believed to be well within the ability of those skilled in the art in view of the flowchart of FIG. 4 in conjunction with the totality of the disclosure herein.

The Quadruple Field-Echo MR Imaging Sequence

Figure 3:
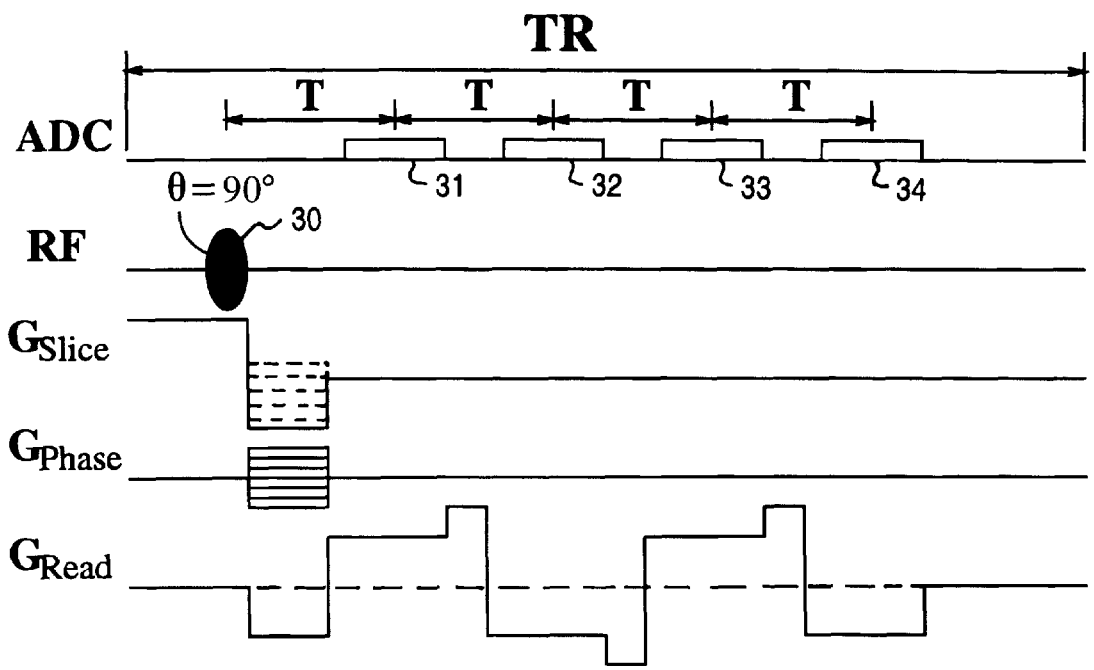
FIG. 3 is an RF and gradient waveform timing diagram of a quadruple field-echo imaging sequence for the quantitative water and fat separation process in accordance with the present invention, the dotted lines in $G_{slice}$ represent phase-encoding for 3-D imaging.

Referring to FIG. 3, a preferred imaging sequence of the present invention basically consists of an RF nuclei nutation ("excitation") pulse, 30, accompanied by the generation of a slice selection gradient pulse, $G_{slice}$, and a phase encoding gradient pulse, $G_{phase}$, followed by four appropriately timed read-out gradient pulses, $G_{read}$, which result in the acquisition of four equally-spaced field-echoes, 31–34. The inter-echo time, T, is preferably set according to the chemical-shift difference between water and fat signals so that the two signals evolve between them an angle of π radians during that period.

For example, in a preferred embodiment of the present invention, the inter-echo time, T, is set equal to $1/\Delta f$ where $\Delta f$ is the water-fat chemical shift difference in Hertz (e.g., at 0.35 Tesla, T=10.3 ms for a 3.2 ppm chemical-shift difference). Two scans of this type are acquired with each having a different scan duration period TR. Preferably, the period of one scan is twice the period of the other with a flip angle of 90°. When a long TR is used, a single scan is sufficient. For the case of 2-D imaging, the pulse sequence is repeated many times in succession for each scan to produce four raw data matrices of, for example, 128×256 data points which correspond to pixels that comprise a MR image—each data point being a complex data value stored as real and imaginary components. For 3-D imaging, the sequence is again repeated many times with different phase-encoding along the slice direction. Each matrix of raw data thus produced is capable of yielding a single field-echo image after Fourier transformation of the data to the frequency domain. After Fourier transformation, the data is further processed as described below to generate fat and water fraction images from the frequency domain image data of the four field-echoes.

Fat and Water Fraction Image Data Processing

Fat and water fractions of each pixel or a desired region of interest (ROI) is determined from signal information from each of the four field-echoes after compensation for magnetic field inhomogeneities and $T_1$ and $T_2^*$ relaxation effects.

When taking into consideration the effects of $T_1$ and $T_2^*$ relaxation, the quadruple-echo signals acquired using the sequence shown in FIG. 3 are described by the following equations:

$$E_m^n = \{W^n(\alpha)^m + F^n(\beta)^m\}e^{-i(m\phi)} \qquad \text{Equ. 1}$$

$$\alpha = e^{-T/T_2^*W} \qquad \text{Equ. 2}$$

$$\beta = -e^{-T/T_2^*F} \qquad \text{Equ. 3}$$

$$W^n = W^0 \frac{1 - e^{-TR^n/T_1W}}{1 - \cos(\theta)e^{-TR^n/T_1W}} \qquad \text{Equ. 4}$$

$$F^n = F^0 \frac{1 - e^{-TR^n/T_1F}}{1 - \cos(\theta)e^{-TR^n/T_1F}} \qquad \text{Equ. 5}$$

where $E_m^n$ is the Fourier transformed signal data from each of the four field-echo signals, where m=1, 2, 3, 4 identifies the four field-echoes; n=1, 2 represents two scans of duration $TR^1$ and $TR^2$, respectively, with $TR^2=2$ $(TR^1)$; φ represents signal phase accumulated during the inter-echo time, T, due to field inhomogeneities; α represents $T_2^*$ factor of the water signal component; β represents the $T_2^*$ factor of the fat signal component; θ represents the RF excitation pulse rotation or "flip" angle; $W^n$ and $F^n$ are water and fat magnetization observed in scan n, respectively; $W^0$ and $F^0$ are the equilibrium magnetization values of water and fat, respectively; $T_{1W}$ and $T_{1F}$ are spin-lattice relaxation times of water and fat, respectively; $T_{2W}^*$ and $T_{2F}^*$ are apparent transverse relaxation times of water and fat, respectively.

i. Compensation of Field Inhomogeneities

To compensate for the effects of background magnetic field inhomogeneities, the phase factor, φ, is determined from the in-phase images as follows:

$$\phi = \frac{1}{2}\text{unwrap}\{\arg[(E_2^1 + E_2^2)(E_4^1 + E_4^2)^*]\} \qquad \text{Equ. 6}$$

where arg [ ] returns the phase angle of its input and * represents conjugation.

Since φ is unambiguous only between –π and π, a guided region-growing phase unwrapping algorithm (such as discussed above) is used to unwrap φ. The effects of field inhomogeneities are then removed from the is field-echo signals, $E_m^n$ according to the following equation:

$$S_m^n = E_m^n e^{i(m\phi)} \qquad \text{Equ. 7}$$

where $S_m^n$ is the signal in the frequency domain with field inhomogeneities removed.

ii. Compensation for $T_2^*$ Relaxation

To take advantage of the fact that the effects of $T_2^*$ relaxation are identical in the two scans of different TR, signals of the two scans are summed:

$$S_m^+ = S_m^1 + S_m^2$$

The effects of $T_2^*$ relaxation are compensated on a pixel by pixel basis, depending on whether the pixel data comprises components of both water and fat or it consists solely of either water or fat signals.

One skilled in the art will appreciate that the following relationship is true only when there is only one component (i.e., either fat or water):

$$S_1^+ S_3^+ - (S_2^+)^2 = 0 \qquad \text{Equ. 8}$$

Likewise, one skilled in the art will also appreciate that "water-only" and "fat-only" pixels can be distinguished according to the following two relationships:

1. A pixel is water-only if:

$$\frac{S_2^+}{S_1^+} + \frac{S_3^+}{S_2^+} + \frac{S_4^+}{S_3^+} > 0$$

2. A pixel is fat-only if:

$$\frac{S_2^+}{S_1^+} + \frac{S_3^+}{S_2^+} + \frac{S_4^+}{S_3^+} < 0$$

For pixels comprising both water and fat signal components, the $T_2^*$ attenuation factor can be determined according to the following relationships:

$$a \equiv (\alpha + \beta) = \frac{S_1^+ S_4^+ - S_2^+ S_3^+}{S_1^+ S_3^+ - (S_2^+)^2} \quad \text{Equ. 9}$$

$$b \equiv (\alpha \beta) = \frac{S_2^+ S_4^+ - (S_3^+)^2}{S_1^+ S_3^+ - (S_2^+)^2} \quad \text{Equ. 10}$$

$$\alpha = \frac{1}{2}\left[a + \sqrt{a^2 - 4b}\right] \quad \text{Equ. 11}$$

$$\beta = \frac{1}{2}\left[a - \sqrt{a^2 - 4b}\right] \quad \text{Equ. 12}$$

For pixels comprising only one component, $\alpha$ and $\beta$ are determined with averaging to improve signal-to-noise performance:

if water-only, $\beta = 0$ and:

$$\alpha = \frac{\frac{S_2^+}{S_1^+} + \frac{S_3^+}{S_2^+} + \frac{S_4^+}{S_3^+}}{3} \quad \text{Equ. 13}$$

if fat-only, $\alpha = 0$ and:

$$\beta = \frac{\frac{S_2^+}{S_1^+} + \frac{S_3^+}{S_2^+} + \frac{S_4^+}{S_3^+}}{3} \quad \text{Equ. 14}$$

After determining the $T_2^*$ attenuation factors, $\alpha$ and $\beta$, the water and fat magnetization are determined by removing the effects of $T_2^*$ relaxation using a linear regression process according to the following situations:

For pixels comprising both water and fat signal components:

$$W^n = \frac{\sum_{m=1}^{4} S_m^n (\beta)^m \sum_{m=1}^{4}(\alpha\beta)^m - \sum_{m=1}^{4} S_m^n (\alpha)^m \sum_{m=1}^{4}(\beta)^{2m}}{\left[\sum_{m=1}^{4}(\alpha\beta)^m\right]^2 - \sum_{m=1}^{4}(\alpha)^{2m} \sum_{m=1}^{4}(\beta)^{2m}} \quad \text{Equ. 15}$$

$$F^n = \frac{\sum_{m=1}^{4} S_m^n (\alpha)^m \sum_{m=1}^{4}(\alpha\beta)^m - \sum_{m=1}^{4} S_m^n (\beta)^m \sum_{m=1}^{4}(\alpha)^{2m}}{\left[\sum_{m=1}^{4}(\alpha\beta)^m\right]^2 - \sum_{m=1}^{4}(\alpha)^{2m} \sum_{m=1}^{4}(\beta)^{2m}} \quad \text{Equ. 16}$$

For pixels comprising only one component:

if water-only:

$$W^n = \frac{\sum_{m=1}^{4} S_m^n (\alpha)^m}{\sum_{m=1}^{4}(\alpha)^{2m}} \quad \text{Equ. 17}$$

if fat-only:

$$F^n = \frac{\sum_{m=1}^{4} S_m^n (\beta)^m}{\sum_{m=1}^{4}(\beta)^{2m}} \quad \text{Equ. 20}$$

iii. Compensation of $T_1$ Relaxation $T_1$ relaxation needs to be considered when a sort TR is used. In case of a single scan with long TR, steps of $T_1$ compensation are skipped.

Knowing $\theta$, $TR^1$ and $TR^2$, the effects of $T^1$ relaxation can be compensated from $W^n$ and $F^n$ according to Equ. 4 and Equ. 5 above. The computation of compensation becomes much simpler if chosen at $\theta = 90°$ and $TR^2 = 2TR^1$. In such cases:

For pixels comprising both water and fat signal components:

$$W^0 = \frac{(W^1)^2}{2W^1 - W^2} \quad \text{Equ. 21}$$

$$F^0 = \frac{(F^1)^2}{2F^1 - F^2} \quad \text{Equ. 22}$$

For pixels comprising only one component:
if water-only:

$$W^0 = \frac{(W^1)^2}{2W^1 - W^2} \quad \text{Equ. 23}$$

$$F^0 = 0 \quad \text{Equ. 24}$$

if fat-only:

$$W^0 = 0 \quad \text{Equ. 25}$$

$$F^0 = \frac{(F^1)^2}{2F^1 - F^2} \quad \text{Equ. 26}$$

iv. Fat and Water Fraction Determination

Finally, fat and water fractions are quantitated according to the following relationship:

$$f = \frac{F^0}{W^0 + F^0} \times 100 \, (\%) \quad \text{Equ. 27}$$

$$w = \frac{W^0}{W^0 + F^0} \times 100 \, (\%) \quad \text{Equ. 28}$$

Figure 6:
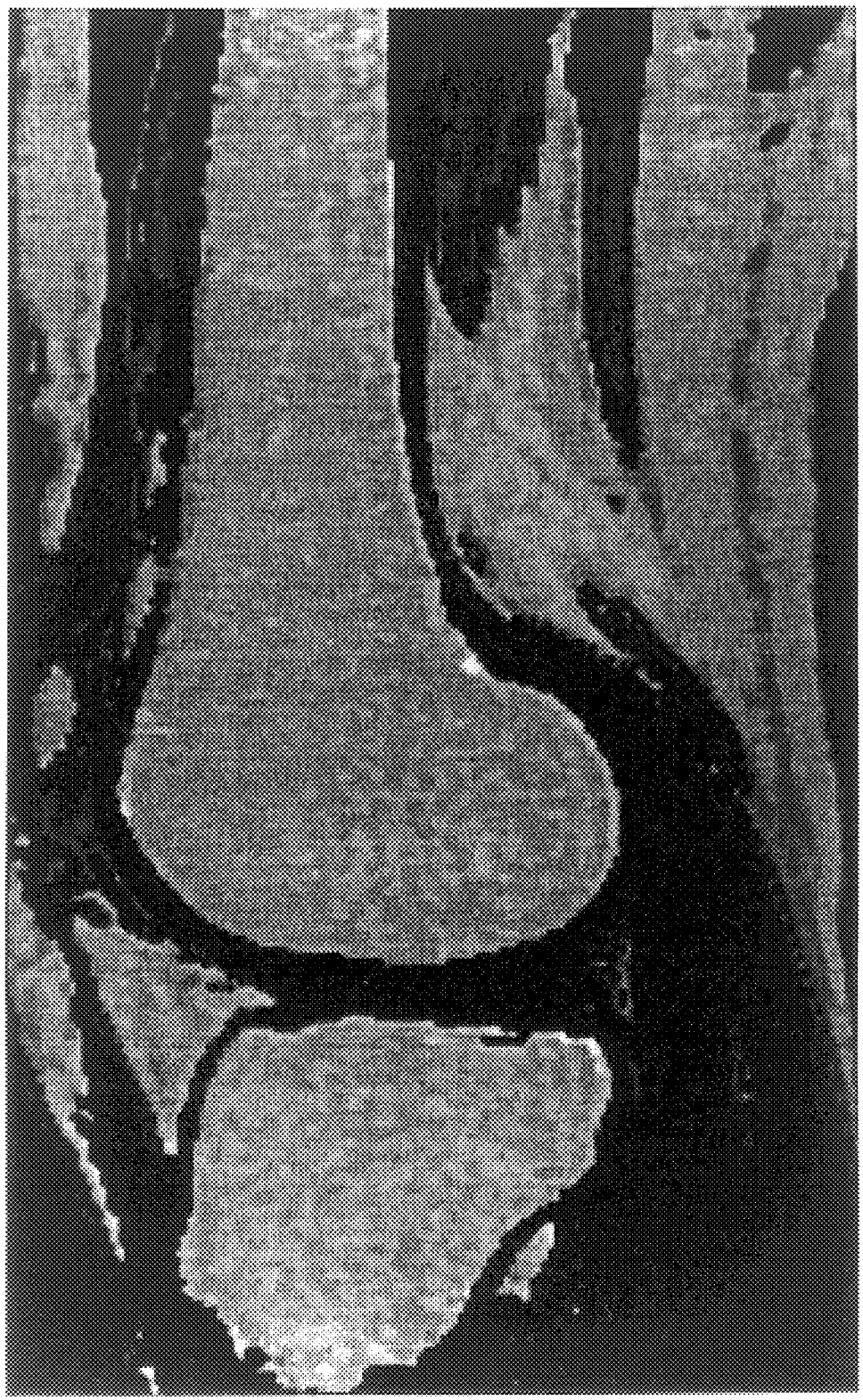
FIG. 6 is a fat fraction image of a human knee generated from the four field-echo images shown in FIG. 5 in accordance with the present invention.

The quantitated fat and water fractions for each pixel are then used to generate composite fat fraction images such as the example fat fraction image shown in FIG. 6.

v. Data Processing Steps

Figure 4A:
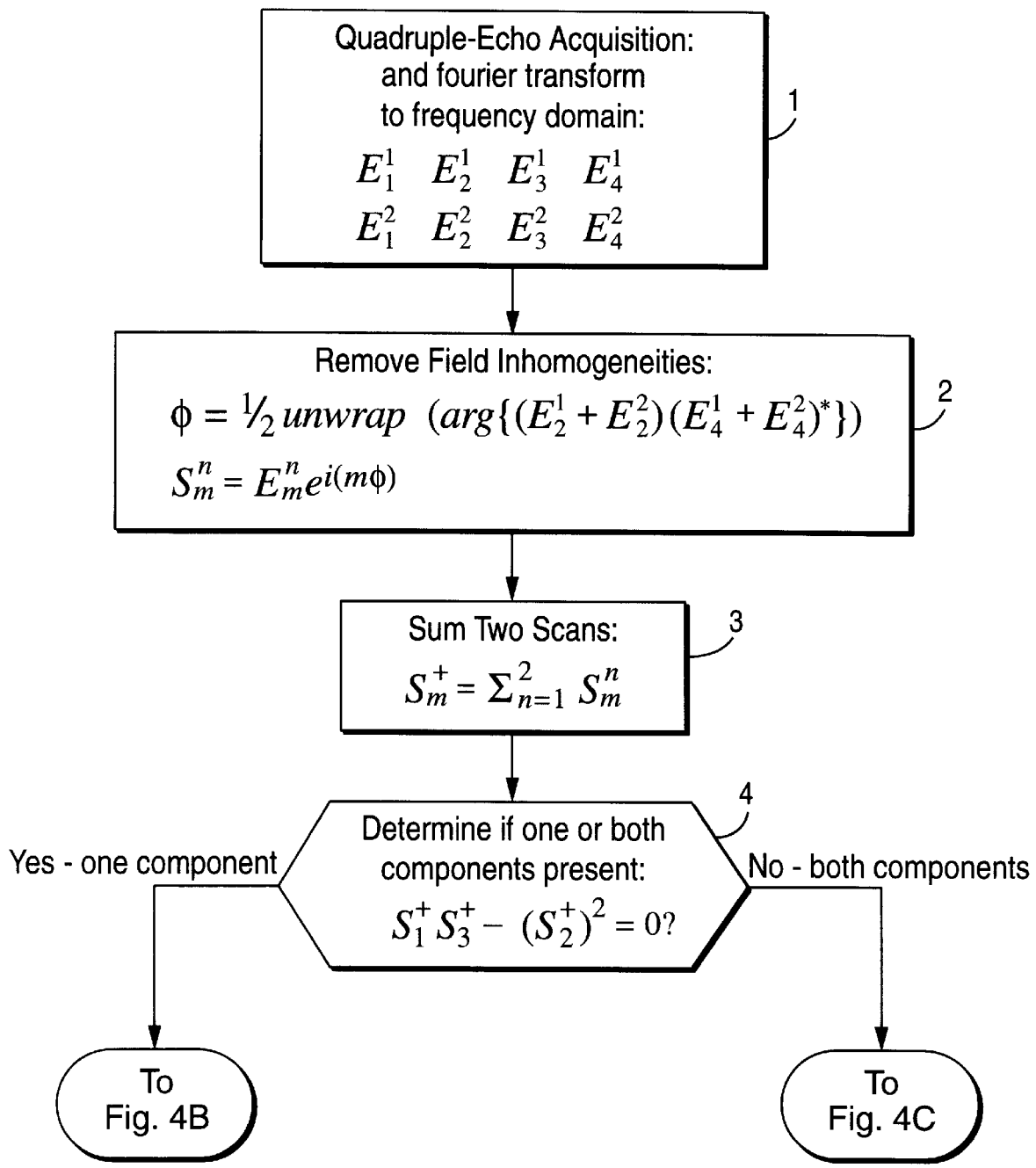
Figure 4B:
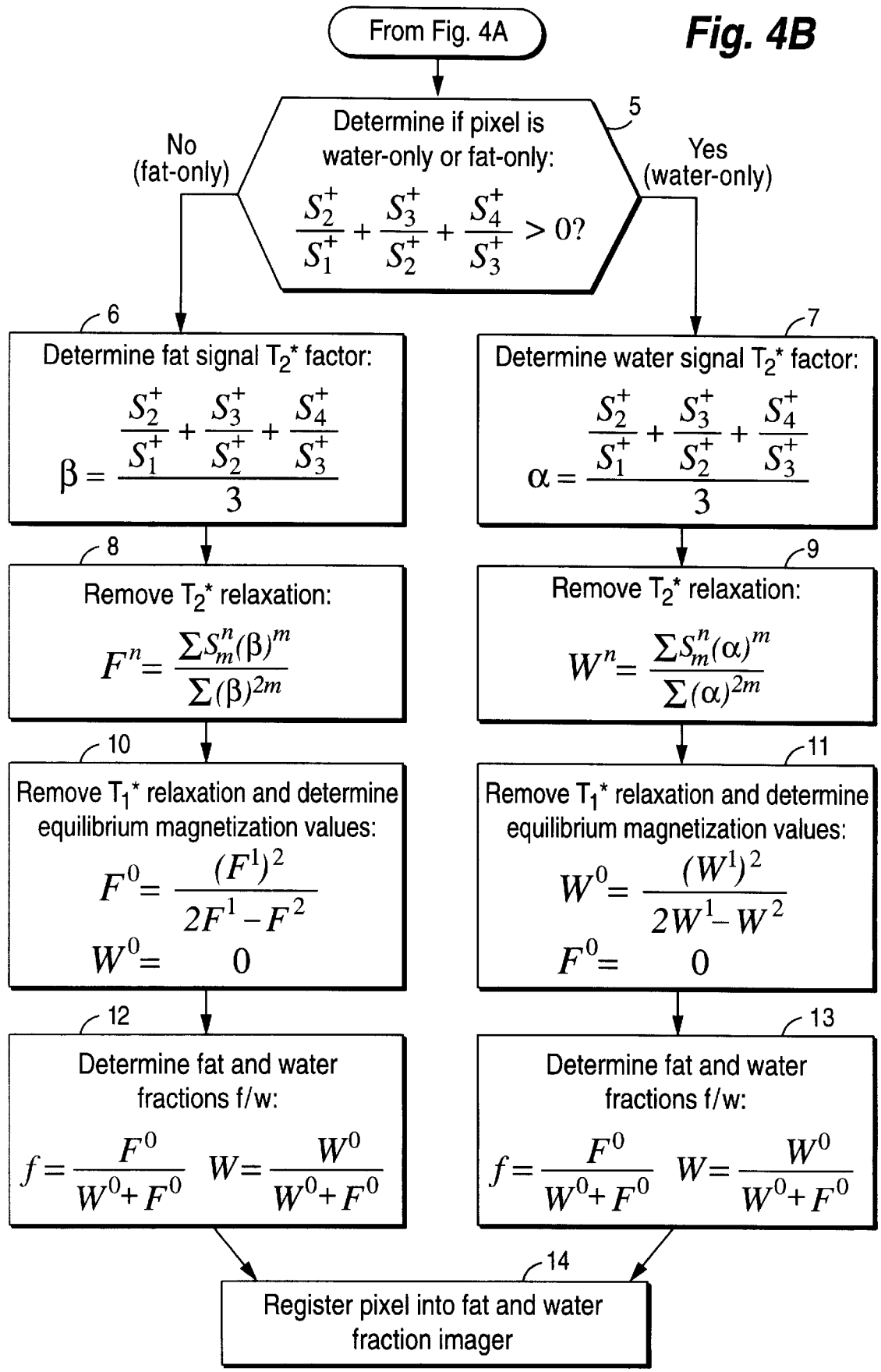

Referring now to FIGS. 4A–4C, a flow diagram is presented that illustrates steps in the data processing method for QWFS as carried out by the MRI system of FIG. 1, for producing fat and water fraction images in accordance with the present invention. These steps are performed on a pixel-by-pixel basis or for a region of interest. All of the steps of the QWFS method of the present invention may be implemented on a computer or processor associated with the MRI system by conventional programming techniques. For example, the QWFS method and image processing of the present invention may be implemented using an Indigo™ SGI work station with programs written in C.

Referring first to FIG. 4A, four field-echo signals from each of two quadruple-echo sequence scans are acquired and Fourier transformed to the frequency domain as indicated at step 1. Alternatively, a single scan is performed with a sufficiently long TR. Next, magnetic field inhomo-geneities are compensated by unwrapping the phase image (through the application of a region growing algorithm) and values for the compensated field-echo signals are determined as indicated at step 2.

In a case of the two scans of different TR, the effects of $T_1$ relaxation and/or $T_2^*$ relaxation effects can be effectively removed through process of linear regression, but only if it is known whether the field-echo signal contains one or both water and fat signal components. Accordingly, in steps 3 and 4, a signal summation and comparison process is carried out that reveals whether either one or both components are present.

In step 3, compensated signals of each field-echo are summed with the corresponding field-echoes in both scans. The products of the different field-echo signals are then compared, as indicated in step 4, to determine whether the pixel or ROI contains both water and fat or it contains either fat-only or water-only.

If only one signal component (either fat or water) is present, $T_2^*$ relaxation and $T_1$ relaxation are compensated according to the steps of FIG. 4B. However, if both water and fat signal components are present, $T_2^*$ and $T_1$ relaxation effects are compensated according to the steps of FIG. 4C.

Assuming it is determined at step 4 that the pixel data contains only one signal component, the pixel data is next determined as comprising either water-only signals or fat-only signals, as indicated in FIG. 4B at step 5. Next, either the fat signal $T_2^*$ attenuation factor, β, or the water signal $T_2^*$ attenuation factor, α, is evaluated as indicated at steps 6 and 7. At this point, the $T_2^*$ relaxation is compensated according to the appropriate regression relationships indicated at steps 8 or 9.

Next, $T_1$ relaxation is compensated and values of equilibrium magnetization of water or fat are determined as indicated at steps 10 and 11. Finally, the fat and water fractions are determined as indicated at steps 12 and 13, and used in the production of fat and water fraction images at step 14.

For the situation where both water signal and fat signal components are present, after determination at step 4, values of fat $T_2^*$ attenuation factor, β, and water $T_2^*$ attenuation factor, α, are determined as indicated at step 15 in FIG. 4C.

At this point, the $T_2^*$ relaxation is compensated according to the appropriate regression relationship as indicated at step 16. Next, $T_1$ relaxation is compensated and values of equilibrium magnetization of water and fat are determined, as indicated in step 17. Finally, fat and water fractions, f and w, are determined and used in the production of fat and water fraction images, as indicated in steps 18 and 19.

vi. Example Images

Images of FIGS. 5, 6 and 7 were acquired with a Toshiba OPART™ MR scanner operated at 0.35 Tesla, using a large X-wing transmit coil for producing RF excitation. For receiving MR signals, an extremity coil was used for knee imaging and a combination of a small body coil and a lumbar spine coil in quadrature mode was used for lumbar spine imaging. The images were generated from data acquired using the above described quadruple field-echo imaging sequence with sequence parameters: T=10.3 ms, θ=90°, $TR^1$=300 ms and $TR^2$=600 ms.

Figure 5A:
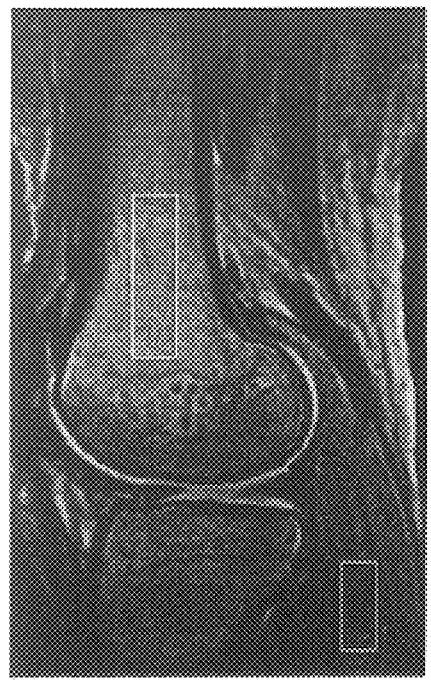
FIGS. 5(a)–5(d) comprise example quadruple field-echo MRI images, showing a human knee, produced in accordance with the present invention.
Figure 5B:
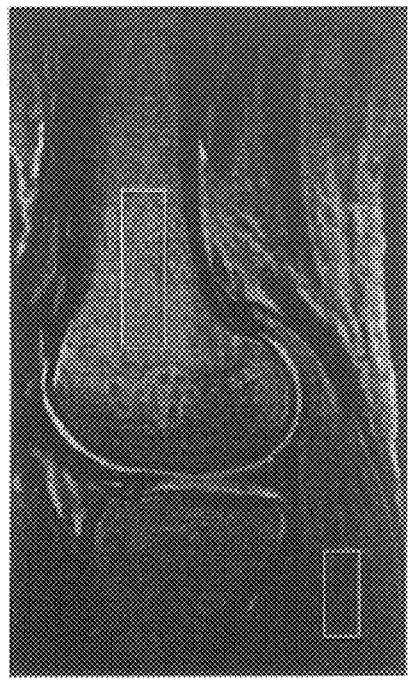

FIGS. 5(a)–5(b) are examples of MRI images of a human knee obtained using the quadruple field-echo sequence of the present invention with TR=300 ms, for four consecutive echo times (TE) corresponding to: (a) TE=10.3 ms, (b) TE=20.6 ms, (c) TE=30.9 ms and (d) TE=41.2 ms. The average signals of the highlighted ROIs are shown plotted in FIG. 8 which also includes the second scan data having TR=600 ms. The knee images were acquired using an FOV (field of view) of 17.0×17.0 $cm^2$, a data matrix of 128×256 data points, four "slices" at 5 mm thickness, NA=4 and a total acquisition time of 7 min. 41 sec. for the two scans.

Figure 5C:
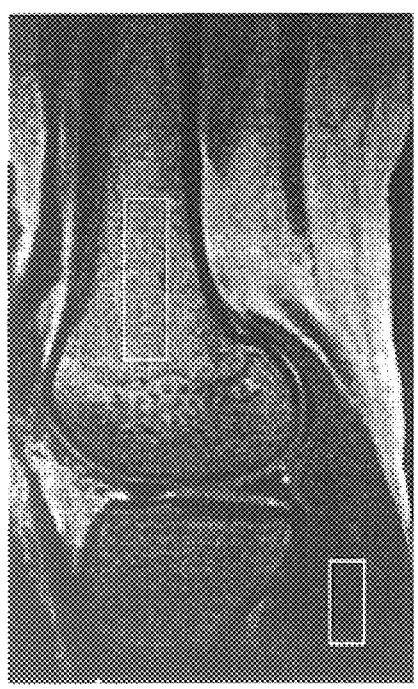
Figure 5D:
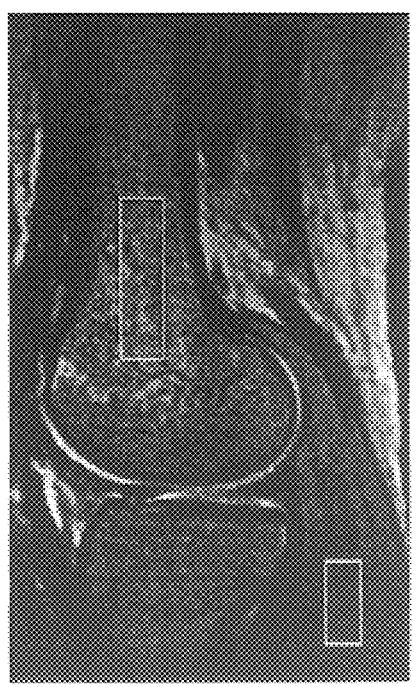

FIG. 6 shows an example fat fraction image of a human knee that was obtained by applying the QWFS data processing method of the present invention on a pixel-by-pixel basis to the data used to generate the images depicted in FIGS. 5(a)–5(c).

FIGS. 7(a)–7(d) are examples of MRI images of a human spine obtained using a quadruple field-echo sequence in accordance with the present invention. In this example, four "slices" at 5 mm thickness were taken, the FOV was 25.0×25.0 $cm^2$, a data matrix size of 128×256 data points was acquired, NA=4, with a total acquisition time of 7 min. 41 sec. for the two scans and a sequence repetition rate (TR) of 300 ms and 600 ms, respectively.

Figure 8A:
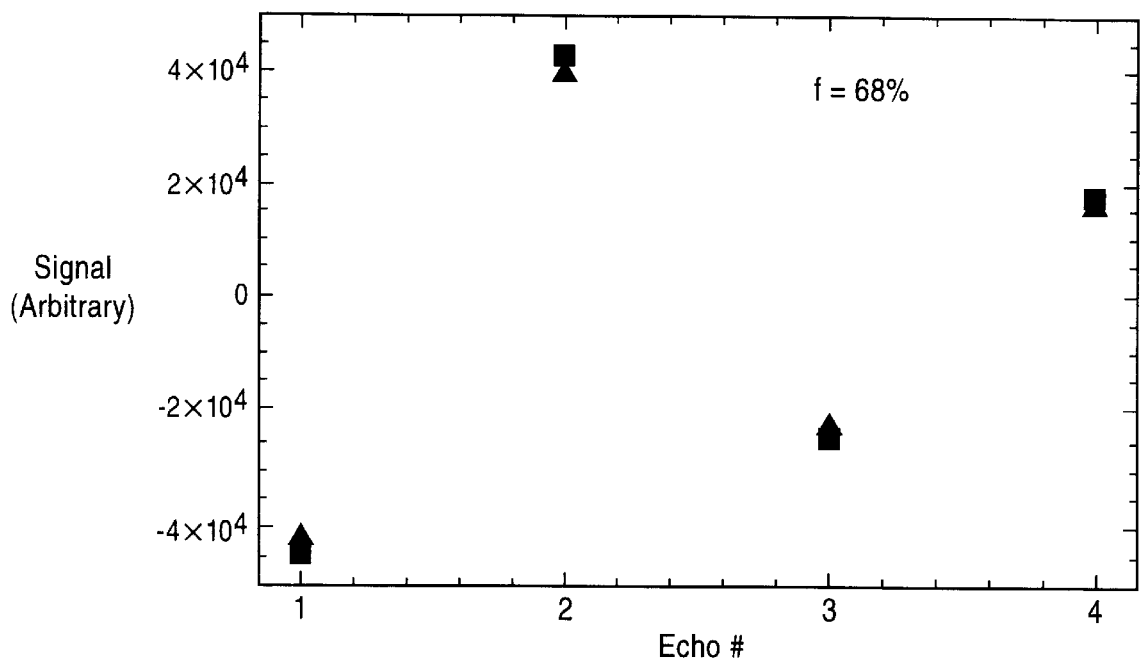
FIGS. 8(a)–8(b) are graphical plots of the average signal intensities and the corresponding back-calculated values versus echo numbers for the ROIs highlighted in FIGS. 5(a)–5(d)
Figure 8B:
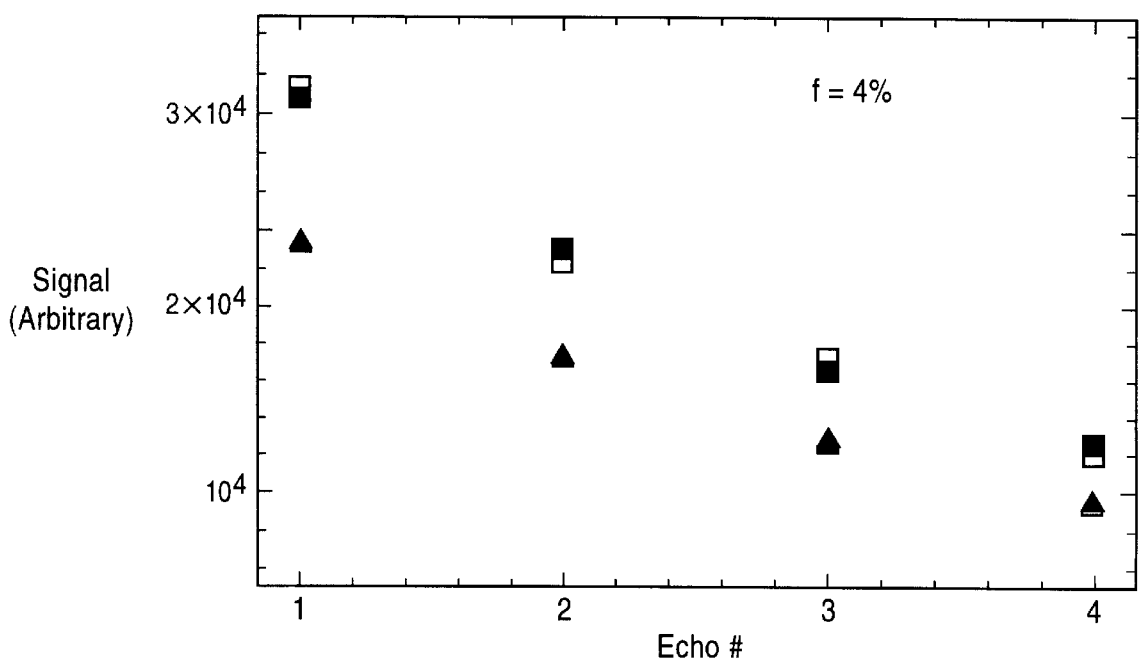
Figure 9A:
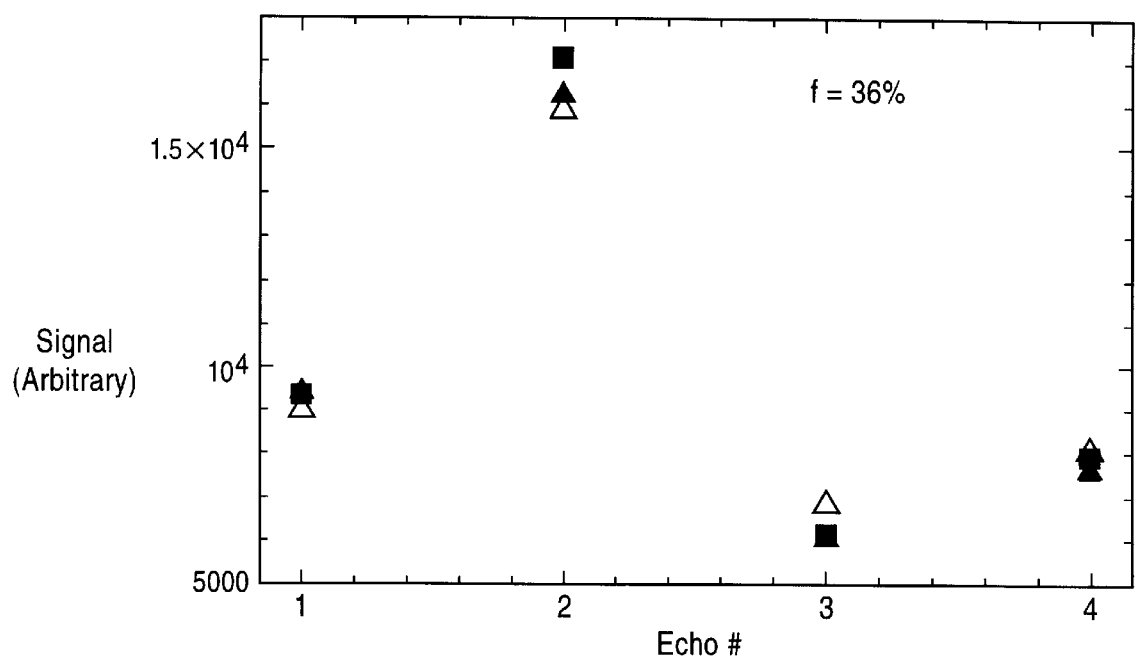
FIGS. 9(a)–9(d) are graphical plots of signal intensities and the corresponding back-calculated values versus echo numbers for the ROIs highlighted in FIGS. 7(a)–7(d).
Figure 9B:
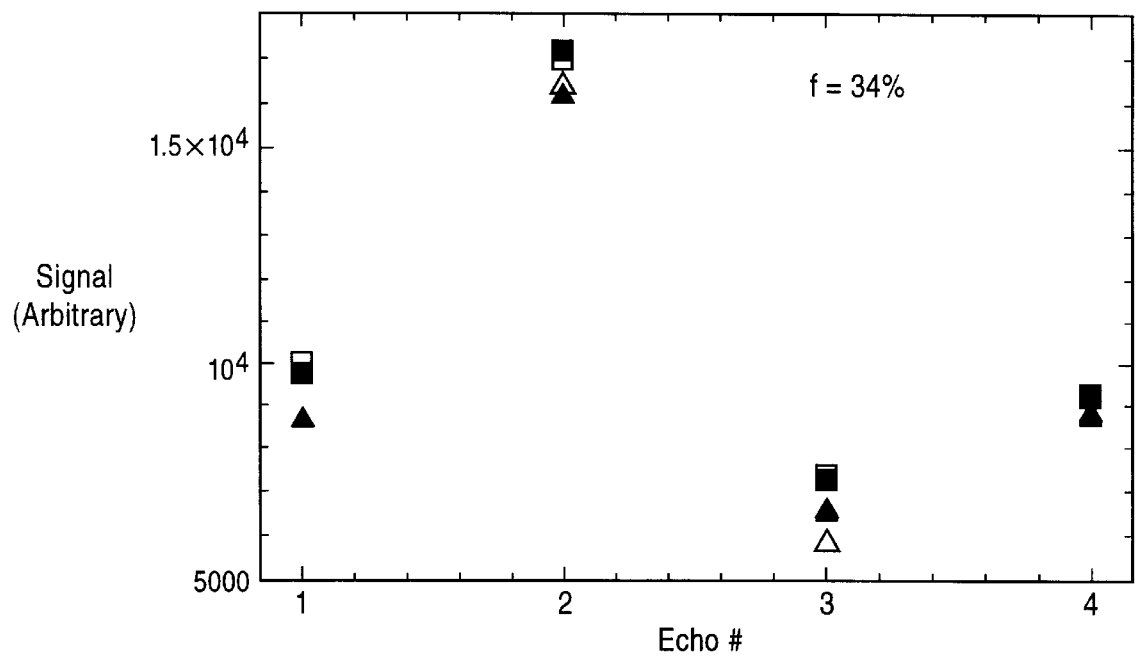
Figure 9C:
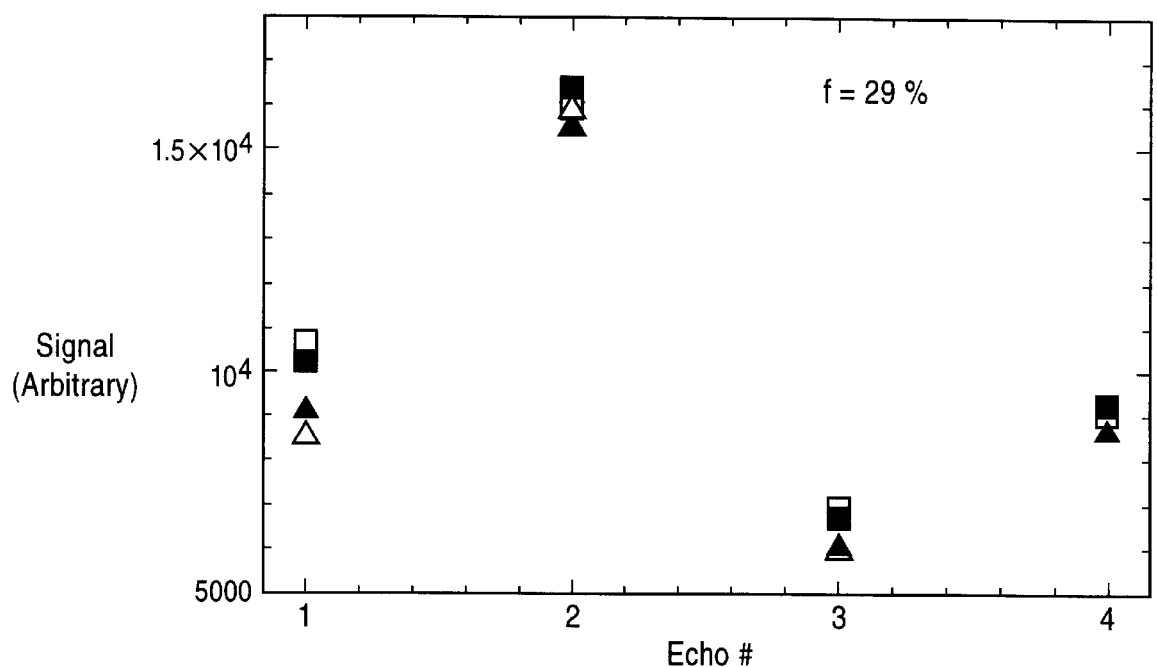
Figure 9D:
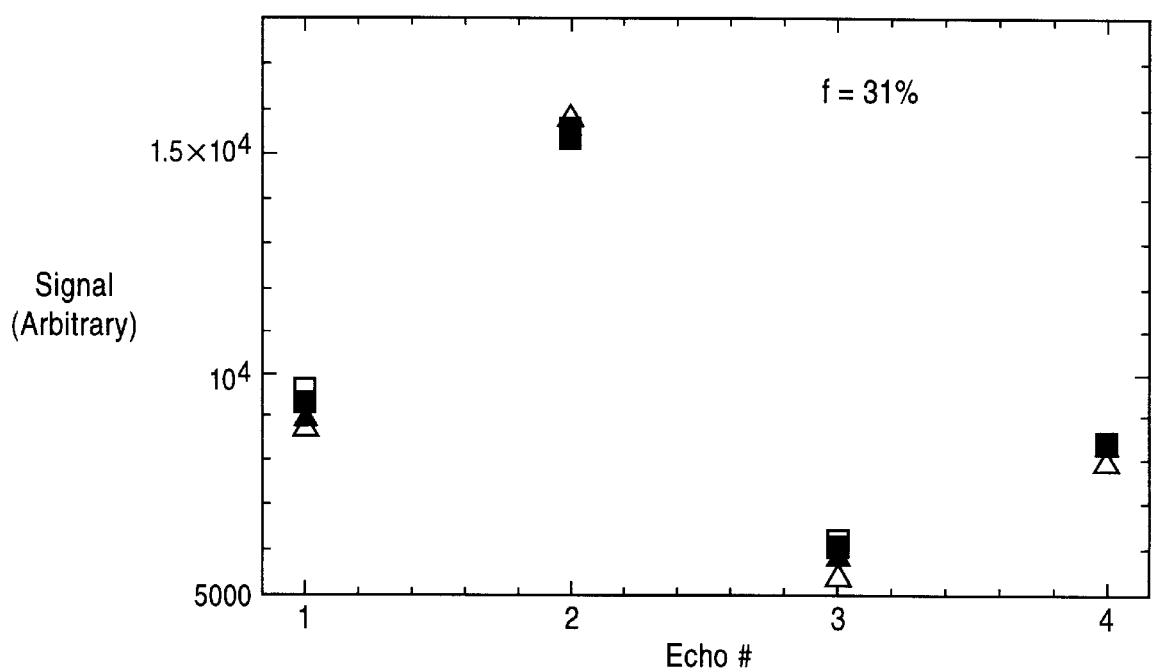

FIGS. 8(a)–8(b) are graphical plots of measured average signal intensities and the corresponding "back-calculated" values versus echo numbers for the ROIs highlighted in FIGS. 5(a)–5(d) for bone marrow 8(a) and muscle tissue 8(b). Open triangles and squares are from images of a TR=300 ms scan and a TR=600 ms scan, respectively. Solid triangles and squares are signals which have been "back-calculated" in correspondence to the parameters obtained from the QWFS process of the present invention. A fat fraction, f, for each ROI is indicated in the upper right-hand corner of each graph.

Figure 7A:
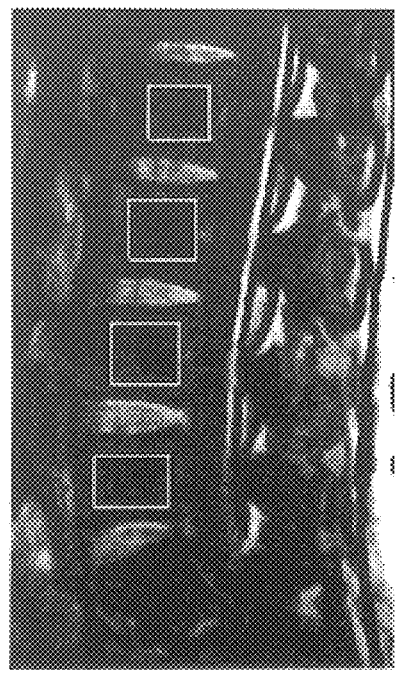
FIGS. 7(a)–7(d) comprise example quadruple field-echo MRI images, showing a human lumbar spine, produced in accordance with the present invention.
Figure 7B:
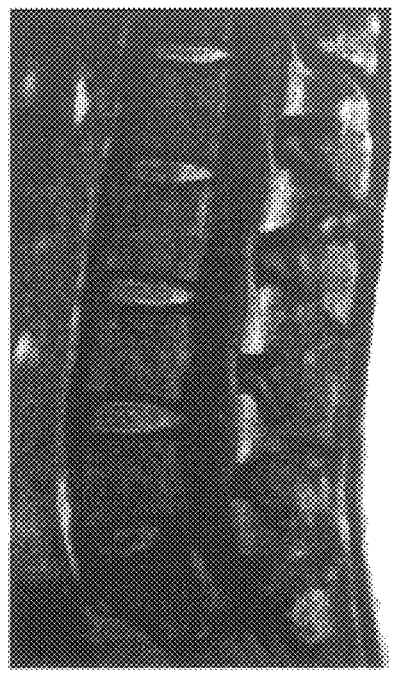
Figure 7C:
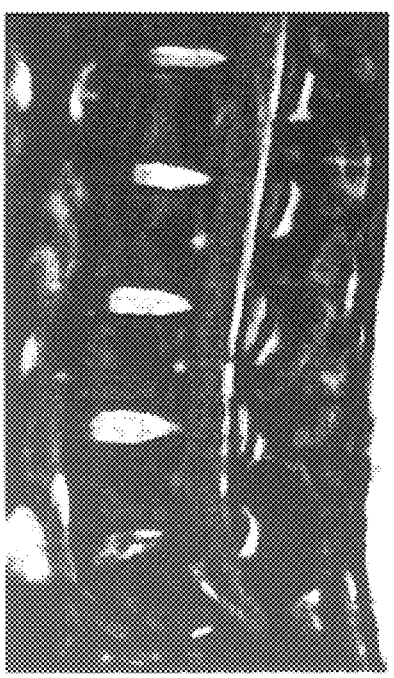
Figure 7D:
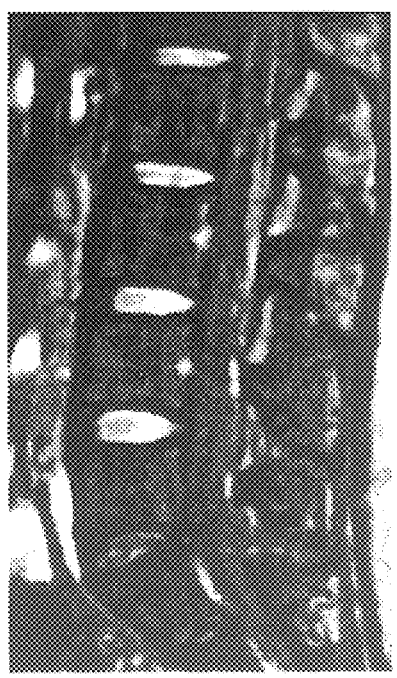

FIGS. 9(a)–9(d) are graphical plots of measured average signal intensities and the corresponding "back-calculated" values versus echo number for the ROIs highlighted in FIG. 7A. In these graphs, measured signals are represented as open triangles and squares; whereas "back-calculated" signals are represented as solid triangles and squares. The fat fraction, f, for each ROI is indicated at the upper right-hand corner of each graph.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of obtaining MRI data and quantitating fractions of a first species of nuclei having a first Larmor frequency and a second species of nuclei having a second Larmor frequency different from said first Larmor frequency, said method comprising the steps of:

a) magnetically orienting nuclei in a body to be imaged;
   b) distributing the NMR frequency of the oriented nuclei by a slice-selection gradient along a first direction;
   c) nutating the oriented nuclei from a selected planar slice by a RF transmission pulse to initiate a TR interval;
   d) imposing a phase distribution on the nutated nuclei with a phase-encoding gradient along a second direction and a readout gradient along a third direction, said second and third directions being perpendicular to both said first direction and each other;

e) reversing the readout gradient to generate and record in a first raw data matrix a first field-echo, with the nuclei of said first species and said second species having a phase difference of substantially 180° at the center of said first field-echo;

f) after said first field-echo, again reversing the readout gradient to generate and record in a second raw data matrix a second field-echo, with the nuclei of said first species and said second species having substantially zero degrees of phase difference at the center of said second field-echo;

g) after said second field-echo, again reversing the readout gradient to generate and record in a third raw data matrix a third field-echo, with the nuclei of said first species and said second species having a phase difference of substantially 180° at the center of said third field-echo;

h) after said third field-echo, again reversing the readout gradient to generate and record in a fourth raw data matrix a fourth field-echo, with the nuclei of said first species and said second species having substantially zero degrees of phase difference at the center of said fourth field-echo;

i) repeating steps (b) through (h) with various phase-encoding gradient pulses to complete said raw data matrices for said second direction;

j) processing said raw data matrices to quantitate fractions of said first species and second species.

2. A method as in claim 1, wherein step (d) further includes sub-steps of imposing additional phase-encoding along the slice-selection direction and repeating steps (b) through (i) a plurality of times with various slice-encoding gradient pulses to complete said raw data matrices for said first direction in a 3-D imaging mode.

3. A method as in claim 1, wherein the time interval between the center of said RF pulse and the center of said first field-echo and between the centers of said successive field-echoes is a same T.

4. A method as in claim 1, wherein two scans are performed to complete two sets of said raw data matrices with $TR^2=2\ TR^1$ and with said RF pulse having a flip angle of 90°.

5. The method of claim 1 wherein step (j) further comprises the steps of:

i) time-reversing said second and fourth field-echoes of said raw data matrices;

ii) Fourier transforming said raw data matrices in all said directions to yield images;

iii) evaluating phase factors due to field inhomogeneities from said images with a guided region-growing algorithm;

iv) phase-correcting said images in accordance with phase factors for field inhomogeneities;

v) deciding whether a region contains both said species or only one of the two said species;

vi) correcting signals of said region for $T_2^*$ relaxation attenuation;

vii) correcting signals of said region for $T_1$ relaxation attenuation;

viii) calculating fractions of said first and second species;

ix) repeating sub-steps i-viii for all regions of interest.

6. A method as in claim 5, wherein said region is a single pixel of said images.

7. A method as in claim 5, wherein said region is a multiple of pixels of said images.

8. A method as in claim 5, wherein said regions of interest are all pixels of said images.

9. A method as in claim 5, wherein said regions of interest are multiple regions of multiple pixels of said images.

10. A method as in claim 5, wherein two fraction images are generated by registering said fraction of said first species in a first fraction image and said fraction of said second species in a second fraction image for all pixels of said images.

11. A method as in claim 5, wherein said first species is water and said second species is fat.

12. An MRI apparatus for generating MRI data and quantitating fractions of a first species of nuclei having a first Larmor frequency and a second species of nuclei having a second Larmor frequency different from said first Larmor frequency, said apparatus comprising:

a) means for magnetically orienting nuclei in a body to be imaged;

b) means for imposing a slice-selection gradient on the nuclei to sensitize a planar slice of nuclei for imaging;

c) means for nutating the selected nuclei by a RF transmission pulse;

d) means for imposing a phase distribution on the nutated nuclei by a phase-encoding and a readout gradient pulses;

e) means for reversing the readout gradient to generate and record in a first raw data matrix a first field-echo, with the nuclei of said first species and said second species having a phase difference of substantially 180° at the center of said first field echo;

f) means for reversing the readout gradient after said first field-echo to generate and record in a second raw data matrix a second field-echo, with the nuclei of said first species and said second species having a phase difference of substantially zero at the center of said second field-echo;

g) means for again reversing the readout gradient after said second field-echo to generate and record in a third data matrix a third field-echo, with the nuclei of said first species and said second species having a phase difference of substantially 180° at the center of said third field-echo;

h) means for again reversing the readout gradient after said third field-echo to generate and record in a fourth raw data matrix a fourth field-echo, with the nuclei of said first species and said second species having a substantially zero degree phase difference at the center of said fourth field-echo;

i) means for varying said phase-encoding gradient pulses and repeating means (b) through (h) to complete said raw data matrices for said phase-encoding directions;

j) means for controlling RF and field gradient pulses so that the time intervals between the center of said RF and said first field-echo and between the centers of said successive field-echoes are same T;

k) means for controlling the nutation angle of said RF pulse and of repeating said acquisition steps for said new data matrices with different TR for generating two different sets of said raw data matrices with $TR^2=2\ TR^1$ and with said RF pulse having a nutation angle of 90°; and l) means for processing said raw data matrices to quantitate fractions of said first species and second species.

13. A method for quantitating fractions of a first species of nuclei having a first Larmor frequency and a second species of nuclei having a second Larmor frequency different from said first Larmor frequency, said method comprising the steps of:

a) generating and acquiring four successive and equally distanced field-echoes, wherein the phase difference between said first species and said second species are alternately 180°, 0 and 180°, and 0 at the corresponding echo centers;

b) repeating step (a) with various phase-encoding to complete four raw data matrices for all phase-encoding and frequency-encoding directions, wherein said first field-echo is in a first raw data matrix, said second field-echo in a second raw data matrix, said third field-echo in a third raw data matrix, and said fourth field-echo in a fourth raw data matrix;

c) time-reversing said second and fourth field-echoes of said raw data matrices;

d) Fourier transforming said raw data matrices to yield images;

e) evaluating phase factors of field inhomogeneities with a guided region-growing phase unwrapping algorithm;

f) phase-correcting said images in accordance to said phase factors;

g) determining whether a region contains both said species of nuclei or only one of the two said species;

h) correcting for $T_2^*$ relaxation attenuation based on the outcome of step (g);

i) correcting for $T_1$ relaxation attenuation;

j) calculating equilibrium magnetization of said first species and of said second species;

k) determining fractions of said first and second species;

l) repeating steps (g) through (k) for all regions of interest; and m) generating fraction images of said first and second species.

14. A propagated MRI signal sequence embodied in a plurality of magnetic field generating and detection coils comprising a MRI apparatus, comprising:

an RF nuclei nutation pulse;

an imaging region selection magnetic gradient producing pulse;

a phase encoding magnetic gradient producing pulse; and a series of read-out magnetic gradient producing pulses having alternating polarity, the read-out pulses being arranged to occur sequentially with respect to the center of the nutation pulse such that four field-echo NMR signals are produced by an object being imaged by the MRI apparatus, the field-echo signals having an inter-echo time, T, that is determined according to a known chemical-shift difference between water and fat such that an angular phase difference of $\pi$ radians evolves between water and fat NMR signal components during the inter-echo time.

15. In an MRI system, a method of obtaining NMR imaging data for use in generating a fat fraction image, comprising the steps of:

generating a RF excitation pulse;

generating a phase-encoding magnetic gradient pulse after generating the RF excitation pulse;

generating a first read-out magnetic gradient pulse after generating the RF excitation pulse and the phase-encoding magnetic gradient pulse;

generating a second read-out magnetic gradient pulse after generating the first read-out magnetic gradient pulse;

generating a third read-out magnetic gradient pulse after generating the second read-out magnetic gradient pulse; generating a fourth read-out magnetic gradient pulse after generating the third read-out magnetic gradient pulse;

wherein field-echo signals separated by an equal inter-echo time period (T) are timely elicited by controlling a timing and polarity of said first through fourth read-out magnetic gradients with respect to said RF excitation pulse such that NMR signals produced by a water species of nuclei develop an angular phase difference of $\pi$ radians (180°) with respect to the NMR signals produced by a fat species of nuclei during the inter-echo time period; and acquiring first, second, third and fourth NMR field-echo signals emitted by excited fat and water species of nuclei during said first through fourth read-out magnetic gradient pulses.

16. The method of claim 15 wherein said first, second, third and fourth NMR field-echo signals are acquired via an RF detection coil.

17. In an MRI system, a method of generating a fat fraction magnetic resonance image of a region of an object comprised of a water species of nuclei having a first Larmor frequency and a fat species of nuclei having a second Larmor frequency different from said first Larmor frequency, said method comprising:

a) generating a first plurality of quadruple field-echo NMR imaging sequences corresponding to a first MRI scan, said first plurality of imaging sequences having first, second, third and fourth read-out magnetic gradient pulses and a sequence repetition period (TR) of a first predetermined duration; wherein first, second, third and fourth NMR field-echo signals emitted by excited fat and water species of nuclei during each imaging sequence are acquired;

b) generating a second plurality of quadruple field-echo NMR imaging sequences corresponding to a second MRI scan, said second plurality of imaging sequences having first, second, third and fourth read-out magnetic gradient pulses and a sequence repetition period (TR) of a second predetermined duration; wherein first, second, third and fourth NMR field-echo signals emitted by excited fat and water species of nuclei during each imaging sequence are acquired; and c) processing the NMR field-echo signals acquired in steps (a) and (b) to generate fat fraction magnetic resonance image data.

18. The method of claim 17 wherein the processing step (c) of NMR field-echo signals further includes sub-steps of:

removing effects of magnetic field inhomogeneities by applying a region growing phase unwrapping algorithm to determine signal phase;

determining if NMR signal components of both fat species of nuclei and water species of nuclei are present in a field-echo signal corresponding to a pixel area of the fat-fraction image;

determining if image data for a pixel region of an image is comprised of only water species of NMR signal components or only fat species of NMR signal components;

if present, determining values for water and/or fat species of NMR signal components;

compensating for $T_2^*$ relaxation effects;

determining equilibrium magnetization values for water and fat species signals which will act to compensate for the effects of $T_1$ relaxation; and determining a fat-fraction value, $f$ for each pixel area of the fat fraction image according to a percentage of signal due to fat species of nuclei out of the total signal due to both fat and water species of nuclei.

19. The method of claim 17 wherein the steps of generating a quadruple field-echo NMR imaging sequence, further comprises the steps of:

i) generating a RF excitation pulse;

ii) generating a phase-encoding magnetic gradient pulse after generating the RF excitation pulse;

iii) generating a first read-out magnetic gradient pulse after generating the RF excitation pulse and the phase-encoding magnetic gradient pulse;

iv) generating a second read-out magnetic gradient pulse after generating the first read-out magnetic gradient pulse;

v) generating a third read-out magnetic gradient pulse after generating the second read-out magnetic gradient pulse; and vi) generating a fourth read-out magnetic gradient pulse after generating the third read-out magnetic gradient pulse;

wherein field-echo signals separated by an equal inter-echo time period (T) are timely elicited by controlling a timing and polarity of said first through fourth read-out magnetic gradients with respect to said RF excitation pulse such that NMR signals produced by a water species of nuclei develop an angular phase difference of $\pi$ radians (180°) with respect to the NMR signals produced by a fat species of nuclei during the inter-echo time period.

20. The method of claim 19 wherein a sequence repetition period of said second predetermined duration is twice a sequence repetition period of said first predetermined duration.

21. An MRI apparatus for producing species-fraction NMR imaging data of tissue containing fat species of nuclei and water species of nuclei, in which water species of nuclei and fat species of nuclei are out of phase, comprising:

means for generating quadruple field-echo NMR imaging sequences of differing repetition periods;

means for acquiring and storing NMR field-echo signal data;

means for analyzing NMR field-echo signal data on a pixel by pixel basis to produce either water or fat species-fraction image data, said field-echo signal data acquired from a pair of MRI scans comprising quadruple field-echo NMR imaging sequences of different repetition periods for each scan.

22. In an MRI system, a method of processing NMR field-echo signals used to produce a species fraction image constituting either a fat-fraction image or a water-fraction image, comprising the steps of:

removing effects of magnetic field inhomogeneities from field-echo signal data by applying a region growing phase unwrapping algorithm to determine signal phase;

determining if NMR signal components of fat species of nuclei and water species of nuclei are present in a field-echo signal corresponding to a pixel area of the fraction image;

determining if image data for a pixel region of a fraction image is comprised of only water species of NMR signal components or only fat species of NMR signal components;

depending on species present, determining values for water and or fat species of NMR signal components;

compensating for $T_2^*$ relaxation effects;

determining equilibrium magnetization values for water and fat species signals which will act to compensate for the effects of $T_1$ relaxation; and for each pixel area of the fraction image, determining a fraction value corresponding to a percentage of signal due to either a fat species or a water species of nuclei out of the total signal due to both fat and water species of nuclei, wherein said fraction value for each pixel area is used in producing either a fat-fraction image or a water-fraction image.

23. A computer program for developing water and fat species fraction image data from NMR signal data acquired via a quadruple field-echo MRI sequence, said program comprising instructions for controlling a computer to:

remove effects of magnetic field inhomogeneities by a applying a region growing phase unwrapping algorithm to determine signal phase;

determine if NMR signal components of fat species of nuclei and water species of nuclei are present in a field-echo signal corresponding to a pixel area of the fat-fraction image;

determine if image data for a pixel region of an image is comprised of only water species of NMR signal components or only fat species of NMR signal components;

determine $T_2^*$ factor values for water and/or fat signal components, if present;

compensate for $T_2^*$ relaxation effects;

determine equilibrium magnetization values for water and fat species signals which compensate for the effects of $T_1$ relaxation;

determine a fat fraction value, $f$, for each pixel area of the fat fraction image according to a percentage of signal due to a fat species of nuclei out of the total signal produced by both fat and water species of nuclei for each pixel area; and determine a water fraction value, w, for each pixel area of the water fraction image according to a percentage of signal due to a water species of nuclei out of the total signal produced by both fat and water species of nuclei for each pixel area.

24. An apparatus for developing either water or fat species-fraction image data from MRI quadruple field-echo sequence data, said apparatus comprising a computer including a storage memory and I/O devices, said memory having stored therein rules for performing NMR signal analysis, said computer programmed to:

remove effects of magnetic field inhomogeneities by applying a region growing phase unwrapping algorithm to determine signal phase;

determine if NMR signal components of fat species of nuclei and water species of nuclei are present in a field-echo signal corresponding to a pixel area of the fat-fraction image;

determine if image data for a pixel region of an image is comprised of only water species of NMR signal components or only fat species of NMR signal components;

determine values for water and/or fat species signal components, if present;

compensate for $T_2^*$ relaxation effects;

determine equilibrium magnetization values for water and fat species signals which will act to compensate for the effects of $T_1$ relaxation; and determine either a fat fraction value or a water fraction value for each pixel area of the species-fraction image according to a percentage of signal due to either a fat or a water species of nuclei out of the total signal due to both fat and water species of nuclei.

* * * * *